United States Patent
Okazaki

(10) Patent No.: US 8,344,260 B2
(45) Date of Patent: Jan. 1, 2013

(54) MULTILAYER WIRING BOARD

(75) Inventor: Toru Okazaki, Osaka (JP)

(73) Assignee: Panasonic Corporation, Osaka (JP)

( * ) Notice: Subject to any disclaimer, the term of this patent is extended or adjusted under 35 U.S.C. 154(b) by 64 days.

(21) Appl. No.: 12/783,015

(22) Filed: May 19, 2010

(65) Prior Publication Data

US 2010/0294554 A1    Nov. 25, 2010

(30) Foreign Application Priority Data

May 19, 2009  (JP) ................................. 2009-120817

(51) Int. Cl.
*H05K 1/03* (2006.01)
*D30D 15/00* (2006.01)

(52) U.S. Cl. ........ 174/255; 174/250; 174/256; 174/258; 29/846; 442/208; 442/209

(58) Field of Classification Search .................. 174/250, 174/255–258; 29/825, 829, 831, 846; 442/181, 442/208–209, 212–213
See application file for complete search history.

(56) References Cited

U.S. PATENT DOCUMENTS

| | | | | |
|---|---|---|---|---|
| 4,372,347 A * | 2/1983 | Olson | ........................ | 139/420 C |
| 4,414,264 A * | 11/1983 | Olson | ........................... | 442/212 |
| 4,513,055 A * | 4/1985 | Leibowitz | ..................... | 442/212 |
| 4,737,672 A * | 4/1988 | Kazami | ........................ | 310/68 R |
| 5,350,621 A | 9/1994 | Yuhas et al. | ................... | 428/209 |
| 5,593,767 A * | 1/1997 | Noda et al. | .................... | 442/210 |
| 6,492,008 B1 * | 12/2002 | Amagi et al. | ................. | 428/209 |
| 7,224,046 B2 | 5/2007 | Abe et al. | | |
| 8,022,310 B2 * | 9/2011 | Okazaki et al. | ............... | 174/255 |
| 8,217,271 B2 * | 7/2012 | Okazaki | ........................ | 174/255 |
| 2005/0218503 A1 | 10/2005 | Abe et al. | | |
| 2007/0120249 A1 | 5/2007 | Kawamoto | | |
| 2009/0052835 A1 | 2/2009 | Okazaki et al. | | |

FOREIGN PATENT DOCUMENTS

| | | |
|---|---|---|
| JP | 2000-151035 | 5/2000 |
| JP | 2001-111218 | 4/2001 |
| JP | 2004/064467 | 7/2004 |
| JP | 2005-217029 | 8/2005 |
| JP | 2007-149870 | 6/2007 |
| JP | 2007-288055 | 11/2007 |
| JP | 2008-85106 | 4/2008 |
| JP | 2009-54621 | 3/2009 |

OTHER PUBLICATIONS

Kevlar® Aramid Fiber Technical Guide, Dupont, Apr. 2000.*
English Translation of: Noritaka Nagashima, "JPCA Standard Built-up Printed Wiring Boards (Terms) (Test Methods)"; JPCA-BU01, Japan Electronics Packaging and Circuits Association, Structural Examples I through 4; 2 pages.
Juhachi Oda et al; "Analysis of Stress and Deflection of Printed Plate Board Using Multilayered Beam Theory"; The Japan Society of Mechanical Engineers; A59(563) pp. 203-208; 6 pages.

* cited by examiner

*Primary Examiner* — Robert J Hoffberg
(74) *Attorney, Agent, or Firm* — Hamre, Schumann, Mueller & Larson, P.C.

(57) ABSTRACT

Saddle warpage of a wiring board at the time of reflow soldering is reduced by canceling out a difference in thermal expansion amount between wiring layers with anisotropy due to variations between the wiring layers in the proportion of copper remaining in the wiring layers C and non-uniformity of wiring elements by a difference in thermal expansion amount with anisotropy between resin base material layers produced according to the material of fiber bundles forming a warp or a weft in at least one resin base layer B, different from the material of other fiber bundles.

13 Claims, 8 Drawing Sheets

(AMOUNT OF WARPAGE: 1.16)mm (AMOUNT OF WARPAGE:0.62)mm (AMOUNT OF WARPAGE : 1. 05)mm (AMOUNT OF WARPAGE:0.57)mm

-- PRIOR ART --

(AMOUNT OF WARPAGE: 1.63)mm (AMOUNT OF WARPAGE:1.54)mm

MULTILAYER WIRING BOARD

FIELD OF THE INVENTION

The present invention relates to a multilayer wiring board of an all-layer build-up structure having at least wiring layers.

BACKGROUND OF THE INVENTION

Multilayer wiring boards of an all-layer build-up structure are components for electronic devices that have been developed for the purpose of forming complicated high-density electronic circuits and mounting various electronic components at high density thereon. Such multilayer wiring boards of an all-layer build-up structure have a structure in which a plurality of wiring layers constituted by copper wiring elements and a resin and a plurality of resin base material layers constituted by a resin and fiber bundles are alternately layered, and are used in various digital devices and mobile devices.

First, a typical multilayer wiring board of an all-layer build-up structure will be described.

FIG. 9 shows the basic configuration of such a multilayer wiring board. In a multilayer wiring board of an all-layer build-up structure (hereinafter referred to as a "board") 100a, n (n: an integer equal to or larger than 3) wiring layers (C1 to Cn) and (n−1) resin base material layers (B1 to B(n−1)) are laminated in an alternately layered manner. In the following description, the wiring layers and the resin base material layers are referred to collectively as "wiring layers C" and "resin base material layers B", respectively, as occasion demands.

The wiring layers C are constituted by copper wiring elements 101 and an insulating resin 103. The resin base material layers B are constituted by a fiber bundle 102 in fabric form and the insulating resin 103 with which the fiber bundle 102 is impregnated. FIG. 9 schematically shows a state in which the fiber bundle 102 is impregnated with the resin 103 as the resin base material layer B. The layers are similarly shown also in the subsequent figures.

As the fiber bundle 102, glass fibers or aramid fibers are ordinarily used. As the insulating resin 103, a thermosetting resin such as an epoxy resin, a phenol resin, polyimide or a BT resin is used.

Typically, the wiring layers C and the resin base material layers B are formed by alternately layering fiber bundles impregnated with an insulating resin and copper foils with wiring patterns formed thereon, and by curing the resin by application of pressure and heat in this state. The resin 103 constituting the wiring layers C is formed by causing a part of the resin with the fiber bundles impregnated to enter gaps between the wiring patterns, at the time of application of pressure and heat.

Although not shown, the wiring layers C are electrically connected via via-holes or through holes formed through the resin base material layers B. The above-described configuration of the multilayer wiring board having an all-layer build-up structure is defined in detail in the following document: "JPCA Standard Build-up Printed Wiring Boards (Terms) (Test Methods)", Edited by Noritaka Nagashima, Japan Electronics Packaging and Circuits Association (see structural examples 3 and 4 on page 2).

The resin base material layers B are divided into a base layer 104 as a central layer in the multilayer structure and build-up layers 105 laminated above and below the base layer 104 in a laminating press process in the manufacture of the board. Resin base materials constituting the base layer 104 and the build-up layers 105 may be the same or different. As a resin base material for each of the build-up layers 105, a single material is used in which the fiber bundle content is constant.

In a reflow soldering process, the board 100a is placed on a reflow belt or reflow pallet, with electronic components temporarily fixed on its front and rear mounting faces, and the temperature of the board is raised from room temperature to 220° C. or more to perform soldering and then lowered to room temperature. In the board 100a at this point, a difference in the amount of thermal expansion occurs between the wiring layers because the proportions of copper remaining therein (the proportions of areas occupied by the copper wiring elements in the entire areas of the wiring layers C) differ from each other. Warpage occurs due to this difference.

The mechanism how warpage of the board occurs will be concretely described with reference to FIG. 10.

A board 100f shown in FIG. 10 has six wiring layers C1 to C6 in this order from the top down and five resin base material layers B1 to B5 interposed between the wiring layers C in this order from the top down. (Each of the resin base material layers B1 and B2 is the build-up layer 105, the resin base material layer B3 is the base layer 104, and each of the resin base material layers B4 and B5 is the build-up layer 105.) The proportions of copper remaining in the wiring layers are 32%, 28%, 37%, 46%, 52% and 54% in the order from the wiring layer C1. In this case, the average of the proportions of copper remaining in the layers (C4 to C6) below the base layer 104 is larger than the average of the proportions of copper remaining in the layers (C1 to C3) above the base layer 104 (the resin base material layer B3).

When the copper wiring element 101 and the resin 103 constituting the wiring layers C are compared, the coefficient of linear expansion of the resin 103 is larger than that of the copper wiring element 101. Therefore, the wiring layers with a higher proportion of copper remaining have a smaller amount of thermal expansion under a temperature load. Thus, in the board 100f shown in FIG. 10, the amount of thermal expansion of the layers above the base layer 104 is larger because the proportion of copper remaining is lower (the amount of the resin is larger), and the amount of thermal expansion of the layers below the base layer is smaller because the proportion of copper remaining is higher (the amount of the resin is smaller). Accordingly, when a temperature load is applied, the board is warped upward convexly.

If the horizontal direction of the board 100f shown in FIG. 10 is defined as a weft direction, and if a direction perpendicular to the plane of projection in FIG. 10 is defined as a warp direction, the board warps in such a manner that the amount of warpage in the weft direction and the amount of warpage in the warp direction differ from each other in ordinary cases, as shown in FIG. 12, because pieces of wiring of an electronic circuit are non-uniformly disposed on the multilayer wiring board. This phenomenon, in which the board warps in saddle form, is called "saddle warpage".

If electronic components are mounted in a state where warpage of the board exists in the reflow soldering process, the reliability of connections between the electronic components and the board is considerably reduced, which is a significant factor that deteriorates the quality of an electronic circuit incorporating the multilayer wiring board.

In order to prevent warpage of the board in the reflow soldering process, the countermeasure shown in Japanese Laid-Open Patent Publication No. 2000-151035 is conventionally adopted. That is to say, as shown in FIG. 9, in order to minimize differences in the amount of thermal expansion derived from the different proportions of copper remaining in the wiring layers C, dummy patterns 108 are formed in the wiring layers C aside from the essential copper wiring elements 101 constituting the electronic circuit, thereby making the proportions of copper remaining in the wiring layers C as uniform as possible.

In a board for a small electronic device requiring high-density mounting of an electronic circuit, however, spaces sufficient for the provision of dummy patterns 108 in wiring layers cannot be secured and it is difficult to reduce warpage of the board. Moreover, there is presently no technique effective in reducing the amount of warpage only in one direction to suppress the above-described saddle warpage.

It is therefore an object of the present invention to provide a multilayer wiring board capable of reducing saddle warpage even if there is no space for providing dummy patterns in wiring layers.

DISCLOSURE OF THE INVENTION

A multilayer wiring board according to the present invention includes n (n is an integer equal to or larger than 4) wiring layers including an insulating resin and a wiring element made of a conductive material, and (n−1) resin base material layers including an insulating resin and fiber bundles in fabric form impregnated with the resin, the wiring layers and the resin base material layers being laminated in an alternately layered manner, wherein the material of part of the fiber bundles as one of a warp and a weft in at least one of the (n−1) resin base material layers is different from that of the other fiber bundles.

In this configuration, the linear expansion coefficient of part of the fiber bundles as one of a warp and a weft in at least one of the resin base material layers is set different from the linear expansion coefficient of the other fiber bundles, thereby producing a difference in thermal expansion amount between the resin base material layers in only one of the warp direction and the weft direction. Consequently, it is possible to reduce saddle warpage of the board in reflow soldering, by canceling out a deformation derived from a difference in thermal expansion coefficient produced between the wiring layers due to variations in the proportion of copper remaining in the wiring layers by utilizing the difference in thermal expansion coefficient between the warp and the weft intentionally given in the resin base material layers.

DESCRIPTION OF THE EMBODIMENT

The present invention will be described with respect to an embodiment thereof.

The configuration of a multiplayer wiring board according to the present invention will be described with respect to a board having six wiring layers and five resin base material layers by way of example.

Figure 1:
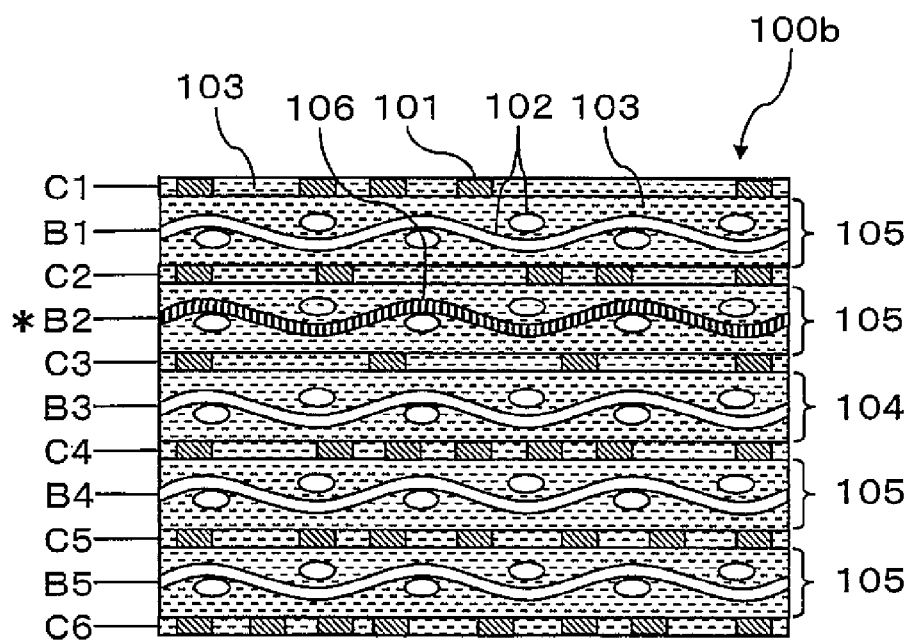
FIG. 1 is a cross-sectional view of a multilayer wiring board according to an embodiment of the present invention.

FIG. 1 shows the configuration of a multilayer wiring board 100$b$ according to this embodiment. The board 100$b$ has six wiring layers C1 to C6 in this order from the top down and five resin base material layers B1 to B5 interposed between the wiring layers in this order from the top down. (Each of the resin base material layers B1 and B2 is a build-up layer 105, the resin base material layer B3 is a base layer 104, and each of the resin base material layers B4 and B5 is the build-up layer 105.) The proportions of copper remaining in the wiring layers are 32%, 28%, 37%, 46%, 52% and 54% in the order from C1. These proportions were extracted from the proportions of copper remaining in the wiring layers C in board CAD (computer aided design) data.

Figure 2:
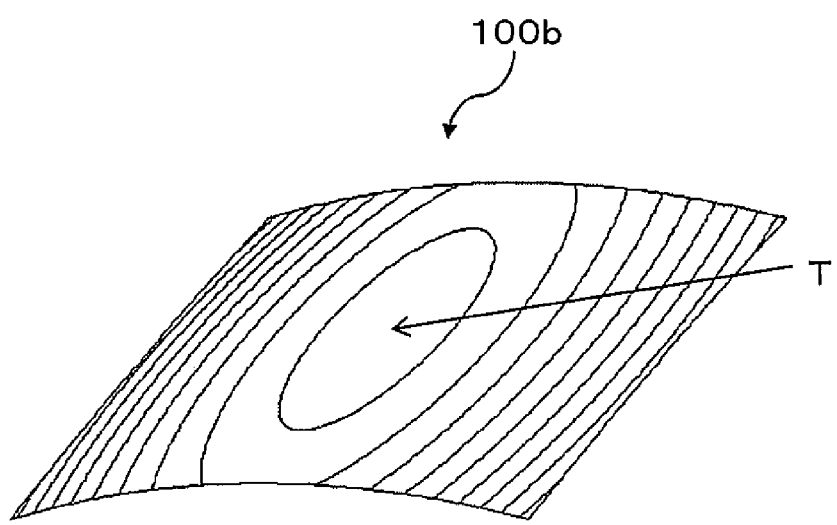
FIG. 2 is a diagram showing a result of a warpage simulation on the multilayer wiring board in FIG. 1.
Figure 9:
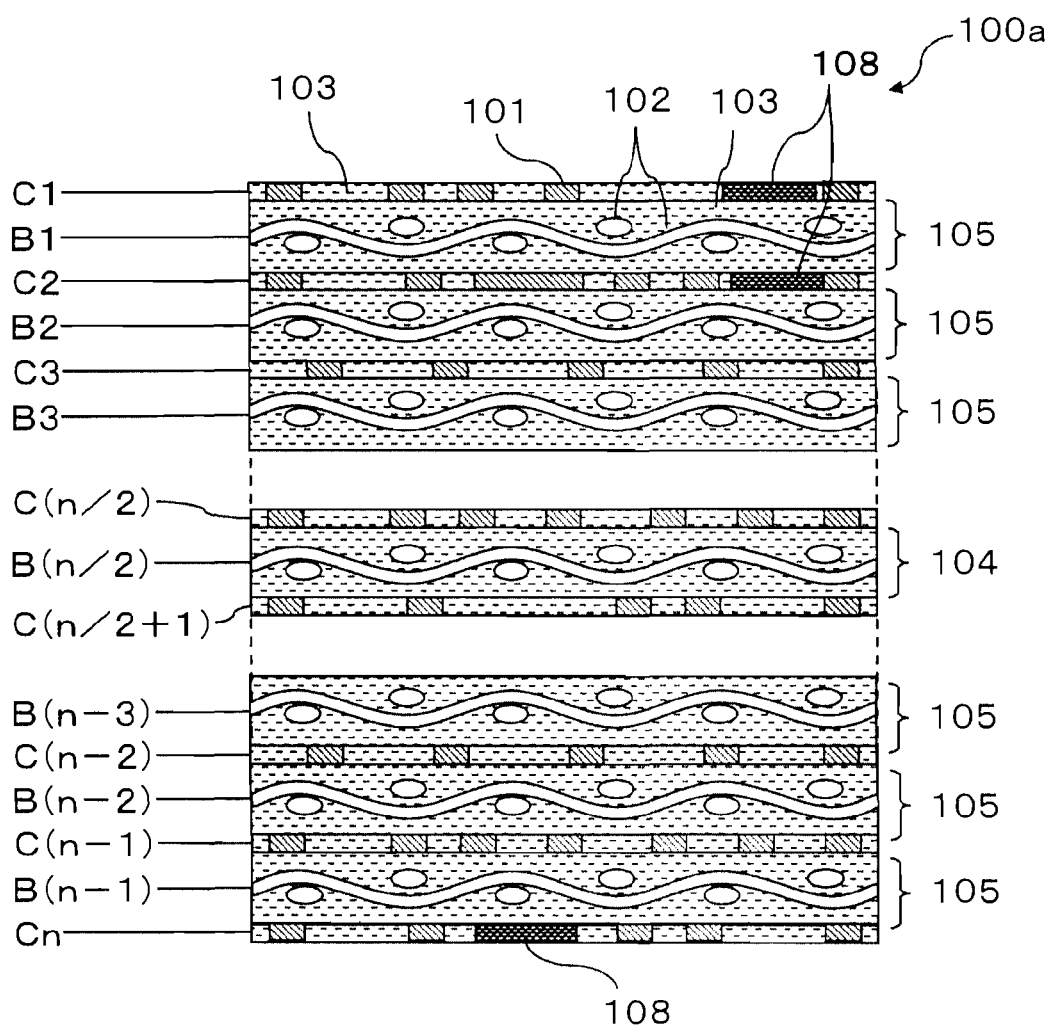
FIG. 9 is a cross-sectional view showing the basic configuration of a multilayer wiring board of an all-layer build-up structure.
Figure 10:
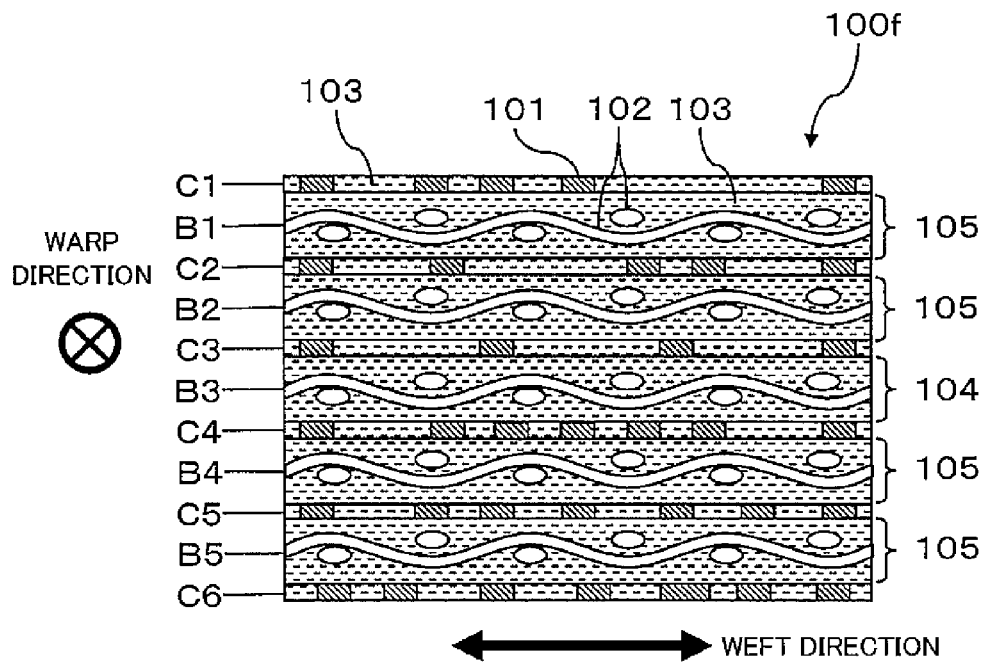
FIG. 10 is a cross-sectional view of a conventional multilayer wiring board.

From the results of a board warpage simulation shown in FIG. 2, it was understood that the board 100$b$ has saddle warpage in which the amount of warpage in a weft direction is larger and the amount of warpage in a warp direction is smaller. In FIG. 1, the same constituent elements as those shown in FIGS. 9 and 10 are indicated by the same reference characters. The detailed description of the same constituent elements will be omitted. The same also applies in descriptions made below.

Prior to the specific description of the configuration of the multilayer wiring board according to this embodiment, the principle of reducing saddle warpage of a multilayer wiring board will be described. In the multilayer wiring board according to the present invention, the linear expansion coefficient of fiber bundles forming a warp or a weft in at least one resin base material layer is set different from the linear expansion coefficient of the other fiber bundles. Resin base material layers have different amounts of thermal expansion depending on the linear expansion coefficients of their fiber bundles and have a smaller amount of thermal expansion if the linear expansion coefficient of the fiber bundles is smaller. It is therefore possible to cancel out a difference in thermal expansion amount produced between wiring layers due to variations in the proportion of copper remaining in the wiring layers by a difference in thermal expansion amount with anisotropy produced between the resin base material layers due to a difference in linear expansion coefficient only in one direction.

As described above, the proportions of copper remaining in the wiring layers in the board 100$b$ are 32%, 28%, 37%, 46%, 52% and 54% in the order from C1. The average of the proportions of copper remaining in the layers (C1 to C3) above the base layer 104 and the average of the proportions of copper remaining in the layers (C4 to C6) below the base layer 104 are 32% and 51%, respectively. The average of the proportions of copper remaining in the wiring layers below the base layer 104 is larger.

As described above, the amount of thermal expansion of each wiring layer C is reduced as the proportion of remaining copper is increased. On the other hand, the amount of thermal expansion of each resin base material layer B is reduced as the linear expansion coefficient of fiber bundles used therein is reduced. In a case where saddle warpage occurs due to non-uniformity of the wiring on the board such that the amount of warpage in the weft direction is larger, the warpage of the board 100b can be reduced by either one of the following methods:

(1) a method of using, at least in one of the build-up layers 105 (the resin base material layers B1 and B2) above the base layer 104, fiber bundles in the weft direction having a linear expansion coefficient smaller than that of other fiber bundles, and (2) a method of using, at least in one of the build-up layers 105 (the resin base material layers B4 and B5) below the base layer 104, fiber bundles in the weft direction having a linear expansion coefficient larger than that of other fiber bundles.

Each of the above-described methods makes it possible to produce a force to warp the resin base material layers B so that the board is convexed downward in the resin base material layers B of the board against a force acting in the wiring layers C of the board to warp the board so that the board is convexed upward. Further, each method is effective as a measure to reduce saddle warpage in which the amount of warpage in the weft direction is larger.

In the above-described methods, a combination of two types of resin base material layers, i.e., one made by using the same fiber bundles forming a warp and a weft and one in which a warp and a weft are formed of fiber bundles made of different materials, is used to reduce warpage of the board 100b.

Making of the resin base material layers in which the material of a warp and the material of a weft are different from each other is performed, when making fiber bundles, for example, by a method of using glass fibers for a warp and using aramid fibers for a weft. The linear expansion coefficient of aramid fibers is smaller than that of glass fibers.

The configuration of the board 100b according to this embodiment will be concretely described below.

In this embodiment, resin base material layers in which bundles of glass fibers as a base material are arranged both for a warp and a weft are used as the resin base material layers B1, B3, B4 and B5 of the five resin base material layers, while a resin base material layer in which bundles of glass fibers and bundles of aramid fibers as a base material are arranged for a warp and a weft, respectively, is used only as the resin base material layer B2 (indicated by a reference mark (*) in FIG. 1).

A method of manufacturing the board 100b will be described.

First, fiber bundles into which glass fibers and aramid fibers having a cross section with a semimajor axis of 25 μm and a semiminor axis of 10 μm were bound were prepared. Bundles of glass fibers as a warp and other bundles of glass fibers as a weft were first woven into a fabric. Bundles of glass fibers as a warp and bundles of aramid fibers as a weft were then woven into a fabric.

Next, the fabrics thus made by weaving the two types of fiber bundles were impregnated with a resin to produce two types of resin base material layers: one in which the warp and the weft were formed of the same material, and the other in which the warp and the weft were formed of the different materials.

Next, holes were formed by laser processing or the like at predetermined positions in one resin base material layer thus produced, and the holes were filled with a conductive resin composition in which a metal powder and a thermosetting resin were mixed, in order to form inner vias in the holes.

Next, the two surfaces of the resin base material layer were covered with two release films each of which has a wiring pattern formed on one surface thereof, and then heated in a pressed state to cure the resin and fix the wiring patterns on the resin base material layer.

The release films were thereafter removed from the resin base material layer. For formation of wiring patterns, a method may alternatively be adopted in which the two surfaces of the resin base material layer are covered with copper foils, and etching is performed to form the wiring patterns.

Fiber bundles and a release film having a wiring pattern formed on one surface thereof were placed on the thus obtained first resin base material layer and the wiring layer, and inner vias were formed using the same method as that described above, followed by the application of pressure and heat. The above-described process was repeated by laminating wiring layers and resin base material layers in the order shown in FIG. 1 while interposing only one resin base material layer whose weft fiber bundle is made of a different material from that of the other resin base material layers, finally manufacturing the board 100b having the five resin base material layers B and the six wiring layers C.

In the manufactured board 100b, the thickness of each of the wiring layers C was approximately 10 μm, and the thickness of each of the resin base material layers B was approximately 30 μm. The thus manufactured board 100b was cut to have a size of 50 mm×50 mm. Under a load at the maximum temperature 260° C. at the time of reflowing, the warpage of the board 100b was 1.16 mm.

As a comparative example, a board 100f having the configuration shown in FIG. 10 was manufactured using as a warp and a weft the same fiber bundles as those used in the board 100b and using the same resin as that in the board 100b, and was cut to have a size of 50 mm×50 mm. A difference between the board 100b and the board 100f resides in that while the fibers in the fiber bundles in the weft direction in the resin base material layer B2 of the board 100b are aramid fibers, the corresponding fibers in the board 100f are glass fibers, i.e., the same material as that in the fiber bundles in the other resin base material layers. Under a load at the maximum temperature 260° C. at the time of reflowing, the warpage of the board 100f was 1.63 mm.

Next, the warpage of the board when the material of the weft fiber bundles in one build-up layer (one of the resin material layers B1, B2, B4 and B5) in the four build-up layers 105 was changed will be described.

In the following description, the results of a simulation of a warped state performed by using an analysis model for the board are shown.

When the analysis model was prepared, parameters in computation formulae were determined so that values of warpage actually measured by using the boards 100b and 100f and values obtained as simulation results were equal to each other. Accordingly, this simulation can express the actual behavior of the board with very high precision.

<Warpage Simulation No. 1>

First, a simulation was performed using the configuration of the board 100b of this embodiment shown in FIG. 1, in which resin base material layers having as a base material an arrangement of bundles of glass fibers forming a warp and a weft were used as the resin base material layers B1, B3, B4, and B5 of the five resin base material layers, and in which a resin base material layer having as a base material an arrangement of bundles of glass fibers and an arrangement of bundles of aramid fibers respectively forming a warp and a weft was used only as the resin base material layer B2.

The proportions of copper remaining in the wiring layers in the order from C1 are 32%, 28%, 37%, 46%, 52% and 54%. The thickness of each wiring layer C is 10 μm, and the thickness of each resin base material layer B is 30 μm. The size of the board is 50 mm×50 mm.

In this warpage simulation, the physical properties of constituent elements of the board are as follows. A copper wiring element 101 has a modulus of longitudinal elasticity of 50000 (MPa) and a coefficient of linear expansion of $17 \times 10^{-6}$ ($1/°$ C.). A resin 103 has a modulus of longitudinal elasticity of 8000 (MPa) and a coefficient of linear expansion of $60 \times 10^{-6}$ ($1/°$ C.) A fiber bundle 102 formed of glass fibers has a modulus of longitudinal elasticity of 70000 (MPa) and a coefficient of linear expansion of $5 \times 10^{-6}$ ($1/°$ C.). A fiber bundle 106 formed of aramid fibers has a modulus of longitudinal elasticity of 65000 (MPa) and a coefficient of linear expansion of $-1.5 \times 10^{-6}$ ($1/°$ C.). The volumetric content of the fiber bundles in each of the resin base material layers, i.e., each of the layers having the glass fibers and the layers having the aramid fibers, is 62%.

FIG. 2 is a diagram showing the shape of warpage in the result of the simulation on the board 100b. FIG. 2 shows the board 100b viewed obliquely from above. A plurality of rings in FIG. 2 represent contours. The distance from a plane defined by the four vertices of the rectangular board to a center T of the central ring represents the amount of warpage of the board 100b. The amount of warpage (the numerical value in the parenthesis in FIG. 2) in the simulation result is the same as the actually measured value 1.16 mm.

<Warpage Simulation No. 2>

Next, the result of a warpage simulation performed on the conventional board 100f shown in FIG. 10 will be described.

In the conventional board 100f, resin base material layers having as a base material an arrangement of bundles of glass fibers forming a warp and a weft are used as the five resin base material layers (B1 to B5). The proportions of copper remaining in the wiring layers are the same as those in the above-described example, i.e., 32%, 28%, 37%, 46%, 52% and 54% in the order from the wiring layer C1 shown in FIG. 10. The thickness of each wiring layer C (10 μm), the thickness of each resin base material layer B (30 μm) and the size of the board (50 mm×50 mm) are the same as those in the above-described example. Further, the physical properties of constituent elements of the board in the warpage simulation are the same as those in the above-described example.

Figure 11:
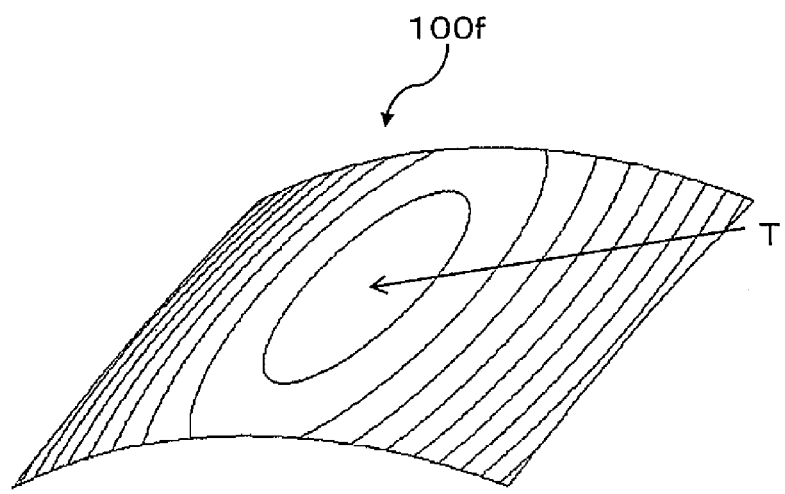
FIG. 11 is a diagram showing a result of a warp simulation on the multilayer wiring board in FIG. 10.
Figure 12:
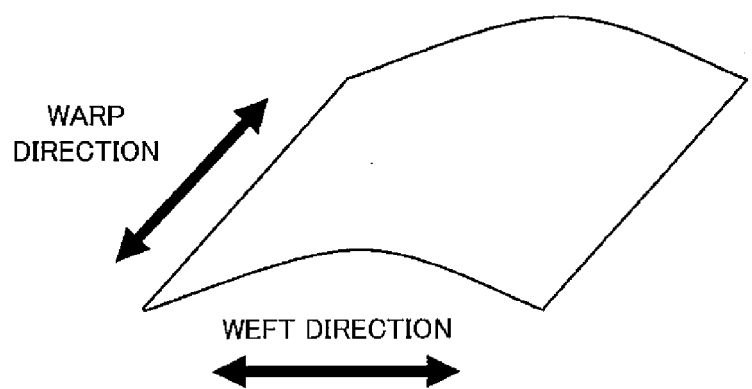
FIG. 12 is an explanatory diagram showing saddle warpage.

FIG. 11 shows the shape of warpage in the result of the simulation on the conventional board 100f. The amount of warpage in the simulation result is the same as the actually measured value 1.63 mm.

From a comparison made between the result shown in FIG. 2 and the result shown in FIG. 11, i.e., the amount of warpage 1.16 mm in the board 100b shown in FIG. 2 and the amount of warpage 1.63 mm in the board 100f shown in FIG. 11, it can be understood that the present invention has reduced the warpage by about 29%. This is because the thermal expansion amount of the aramid fibers used as the weft in the resin base material layer (B2) in the board 100b is smaller than that of the glass fibers in the other fiber bundles.

In the board 100f of FIG. 10, in which the same fiber bundles of the resin base material layers B are provided as a weft and warp, the occurrence of warpage at the time of temperature loading is due to a difference in the amount of thermal expansion resulting from layer-to-layer variations in the proportion of copper remaining in the wiring layers C. In the case of the board 100f, the proportions of copper remaining are 32%, 28%, 37%, 46%, 52% and 54% in the order from the wiring layer C1, that is, the proportion of copper remaining becomes higher along the direction toward the lower side. Thus, a force to warp the board 100f so that the board 100f is convexed upward acts in the six wiring layers C.

In contrast, in the board 100b shown in FIG. 2, a force to warp the board so that the board is convexed downward acts only along the weft direction in the resin base material layer B2, because the linear expansion coefficient of the weft (aramid fibers) is smaller than that of the warp (glass fibers) in the resin base material layer B2 and the terminal expansion amount only in the weft direction is smaller than that in the other resin base material layers. Accordingly, the force acting in the resin base material layers B to warp the board so that the board is convexed downward acts to cancel out the force acting in the wiring layers C to warp the board so that the board is convexed upward, thus reducing the warpage.

<Warpage Simulation No. 3>

Figure 3:
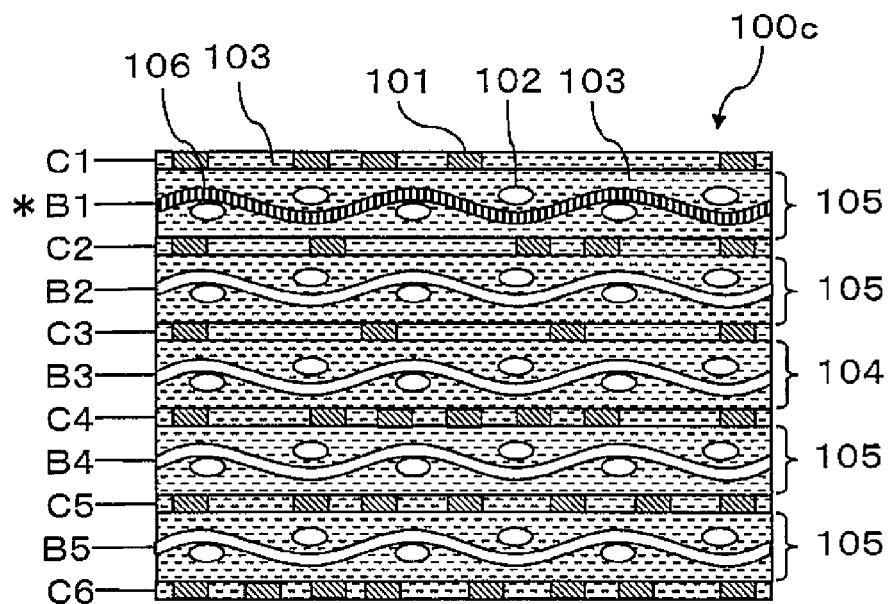
FIG. 3 is a cross-sectional view showing another configuration of the multilayer wiring board according to the embodiment of the present invention.

FIG. 3 shows the configuration of a board 100c. The board 100c has six wiring layers C1 to C6 in this order from the top down and has five resin base material layers B1 to B5 interposed between the wiring layers C in this order from the top down. (Each of the resin base material layers B1 and B2 is the build-up layer 105, the resin base material layer B3 is the base layer 104, and each of the resin base material layers B4 and B5 is the build-up layer 105.) The proportions of copper remaining in the wiring layers C are 32%, 28%, 37%, 46%, 52% and 54% in the order from the wiring layer C1. In these respects, the disposition and configuration are the same as those in the above-described board 100b.

In the board 100c shown in FIG. 3, resin base material layers having as a base material an arrangement of bundles of glass fibers forming a warp and a weft were used for the resin base material layers B2, B3, B4 and B5, and a resin base material layer having as a base material an arrangement of bundles of glass fibers and an arrangement of bundles of aramid fibers respectively forming a warp and a weft was used only for the resin base material layer B1 forming the outermost layer positioned at the top side (indicated by a reference mark (*) in FIG. 3).

Details of the configuration other than those described above, i.e., the thickness of each wiring layer C, the thickness of each resin base material layer B and the size of the board are the same as those in the board 100b. Further, the physical properties of the constituent elements of the board in the warpage simulation are the same as those in the above-described example.

Figure 4:
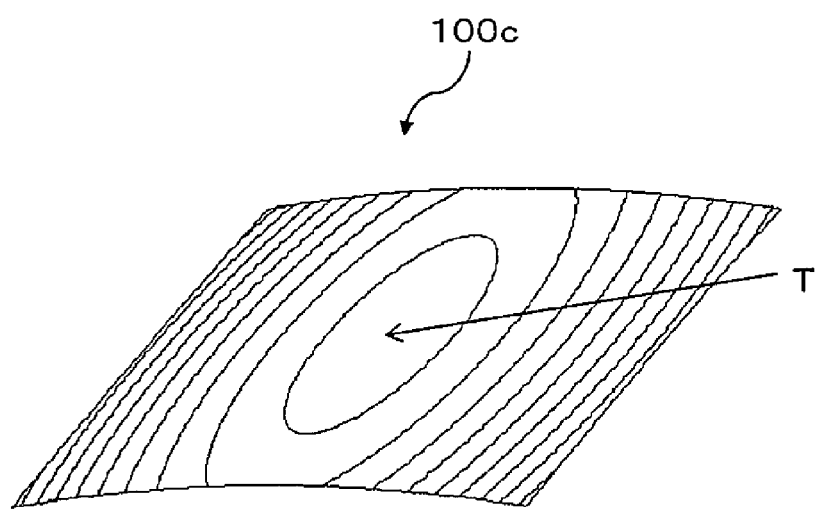
FIG. 4 is a diagram showing a result of a warpage simulation on the multilayer wiring board in FIG. 3.

FIG. 4 shows the result of the warpage simulation under a load at the maximum temperature 260° C. at the time of reflowing. From a comparison made between the result shown in FIG. 4 and the result shown in FIG. 11, i.e., the amount of warpage 0.62 mm in the board 100c shown in FIG. 4 and the amount of warpage 1.63 mm in the board 100f shown in FIG. 11, it can be understood that the present invention has reduced the warpage by about 62%.

In the board 100c shown in FIG. 3, the weft (aramid fibers) has a linear expansion coefficient smaller than that of the warp (glass fibers) in the resin base material layer B1. Only in the corresponding weft direction, the amount of thermal expansion is smaller than that in the other resin base material layers. A force therefore acts in the five resin base material layers B to warp the board 100c so that the board 100c is convexed downward. Accordingly, the force acting in the resin base material layers B to warp the board so that the board is convexed downward acts to cancel out the force acting in the wiring layers C to warp the board so that the board is convexed upward, thus reducing the warpage.

Each of the boards 100c and 100b uses, as a weft, fiber bundles having a linear expansion coefficient larger than that of other fiber bundles in the resin base material layers (B1 and B2) above the base layer 104. However, the effect of reducing warpage in the board 100c is higher than the effect of reducing warpage in the board 100b. This is due to the placement of the resin base material layer using the weft having a larger linear expansion coefficient. The highest effect can be obtained when the resin base material layer using fiber bundles such that the linear expansion coefficients of the warp and the weft are different from each other is placed in the outermost layer.

Figure 13:
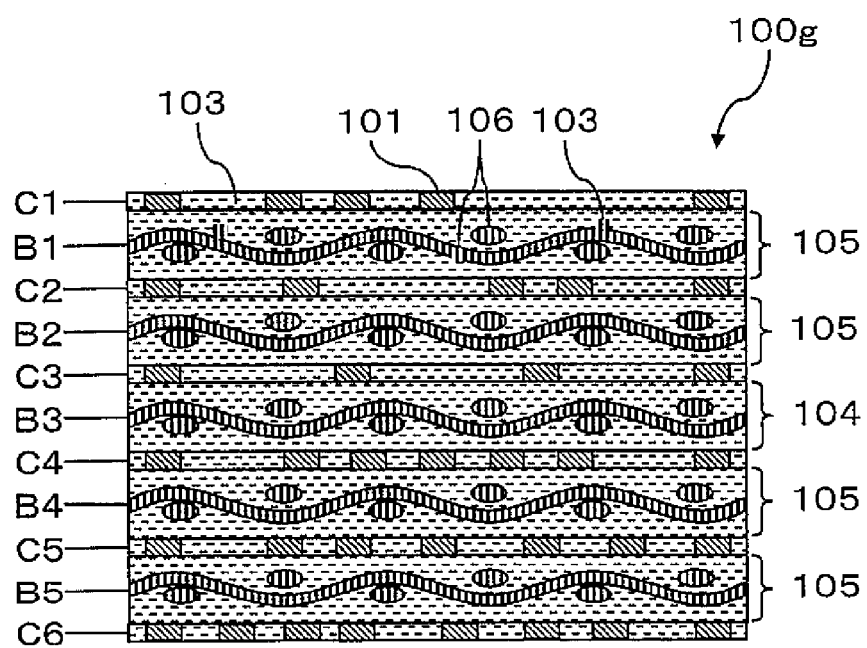
FIG. 13 is a cross-sectional view of a conventional multilayer wiring board.

On the other hand, a board 100g shown in FIG. 13 was manufactured by entirely replacing glass fibers with aramid fibers as the material of the fiber bundles in the board 100f shown in FIG. 10. The board 100g differs from the board 100f only in changing the material of the fiber bundles as described above and is the same as the board 100f with respect to the other details of the configuration. Under a load at the maximum temperature 260° C. at the time of reflowing, the warpage of the board 100g was 1.54 mm.

<Warpage Simulation No. 4>

Next, the result of a warpage simulation performed on the conventional board 100g shown in FIG. 13 will be described.

In the board 100g that differs from the conventional board 100f only in changing the material of the fiber bundles, resin base material layers having as a base material an arrangement of bundles of aramid fibers forming a warp and a weft are used as the five resin base material layers (B1 to B5). The proportions of copper remaining in the wiring layers are the same as those in the above-described example, i.e., 32%, 28%, 37%, 46%, 52% and 54% in the order from the wiring layer C1 shown in FIG. 13. The thickness of each wiring layer C (10 μm), the thickness of each resin base material layer B (30 μm) and the size of the board (50 mm×50 mm) are the same as those in the above-described example. Further, the physical properties of constituent elements of the board in the warpage simulation are the same as those in the above-described example.

Figure 14:
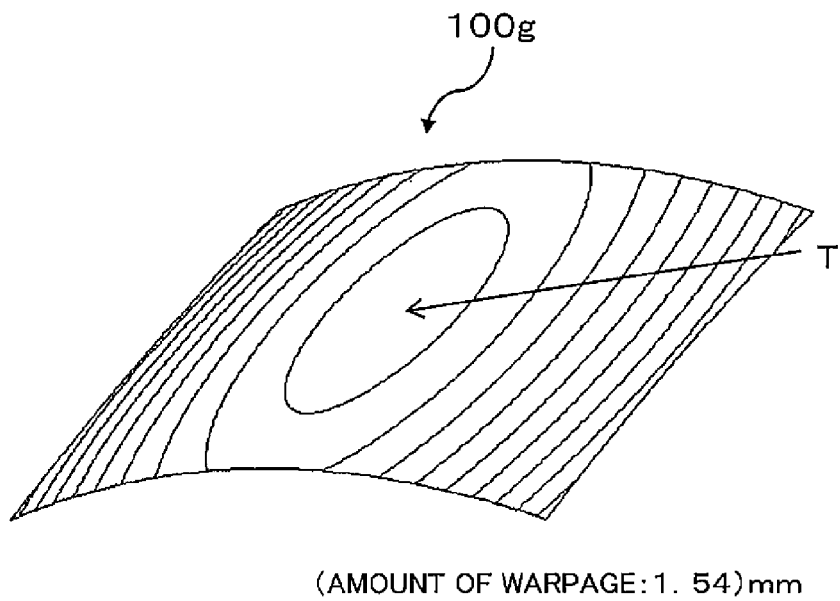
FIG. 14 is a diagram showing a result of a warpage simulation on the multilayer wiring board in FIG. 13.

FIG. 14 shows the shape of warpage in the result of the simulation on the conventional board 100g. The amount of warpage in the simulation result is the same as the actually measured value 1.54 mm.

<Warpage Simulation No. 5>

Figure 5:
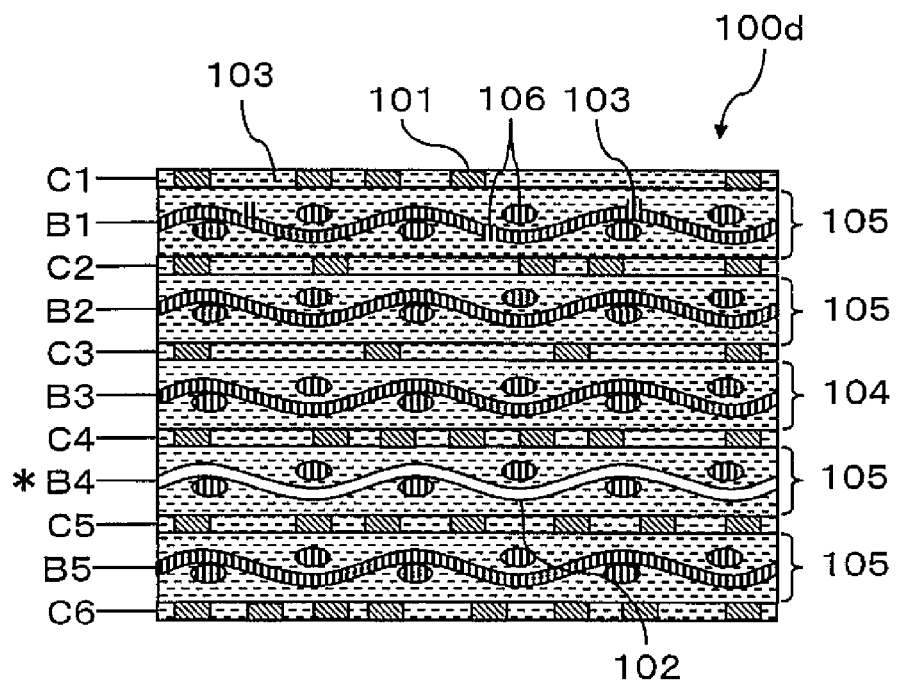
FIG. 5 is a cross-sectional view showing still another configuration of the multilayer wiring board according to the embodiment of the present invention.

FIG. 5 shows the configuration of a board 100d. The board 100d has six wiring layers C1 to C6 in this order from the top down and has five resin base material layers B1 to B5 interposed between the wiring layers in this order from the top down. (Each of the resin base material layers B1 and B2 is the build-up layer 105, the resin base material layer B3 is the base layer 104, and each of the resin base material layers B4 and B5 is the build-up layer 105.) The proportions of copper remaining in the wiring layers C are 32%, 28%, 37%, 46%, 52% and 54% in the order from the wiring layer C1. In these respects, the disposition and configuration are the same as those in the above-described board 100b.

In the board 100d shown in FIG. 5, resin base material layers having as a base material an arrangement of bundles of aramid fibers forming a warp and a weft were used for the resin base material layers B1, B2, B3 and B5, and a resin base material layer having as a base material an arrangement of bundles of aramid fibers and an arrangement of bundles of glass fibers respectively forming a warp and a weft was used only for the resin base material layer B4 positioned below the base layer 104 (indicated by a reference mark (*) in FIG. 5).

Details of the configuration other than those described above, i.e., the thickness of each wiring layer C, the thickness of each resin base material layer B and the size of the board are the same as those in the board 100b. Further, the physical properties of the constituent elements of the board in the warpage simulation are the same as those in the above-described example.

Figure 6:
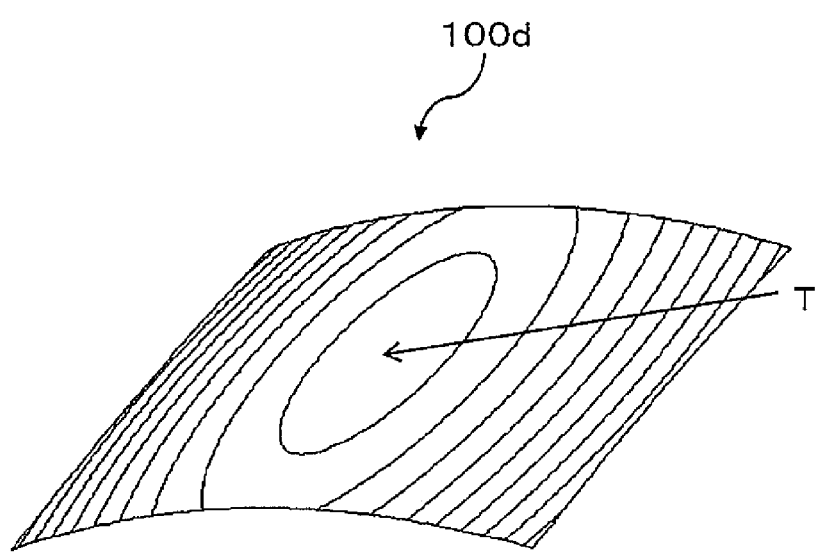
FIG. 6 is a diagram showing a result of a warpage simulation on the multilayer wiring board in FIG. 5.

FIG. 6 shows the result of the warpage simulation under a load at the maximum temperature 260° C. at the time of reflowing. From a comparison made between the result shown in FIG. 6 and the result shown in FIG. 14, i.e., the amount of warpage 1.05 mm (in the board 100d) in FIG. 6 and the amount of warpage 1.54 mm (in the board 100g) in FIG. 14, it can be understood that the present invention has reduced the warpage by about 32%.

In the board 100d shown in FIG. 6, the weft (glass fibers) has a linear expansion coefficient larger than that of the warp (aramid fibers) in the resin base material layer B4. Only in the corresponding weft direction, the amount of thermal expansion is larger than that in the other resin base material layers. A force therefore acts only in the weft direction of the resin base material layer B4 to warp the board so that the board is convexed downward. Accordingly, the force acting in the resin base material layers B to warp the board so that the board is convexed downward acts to cancel out the force acting in the wiring layers C to warp the board so that the board is convexed upward, thus reducing the warpage.

<Warpage Simulation No. 6>

Figure 7:
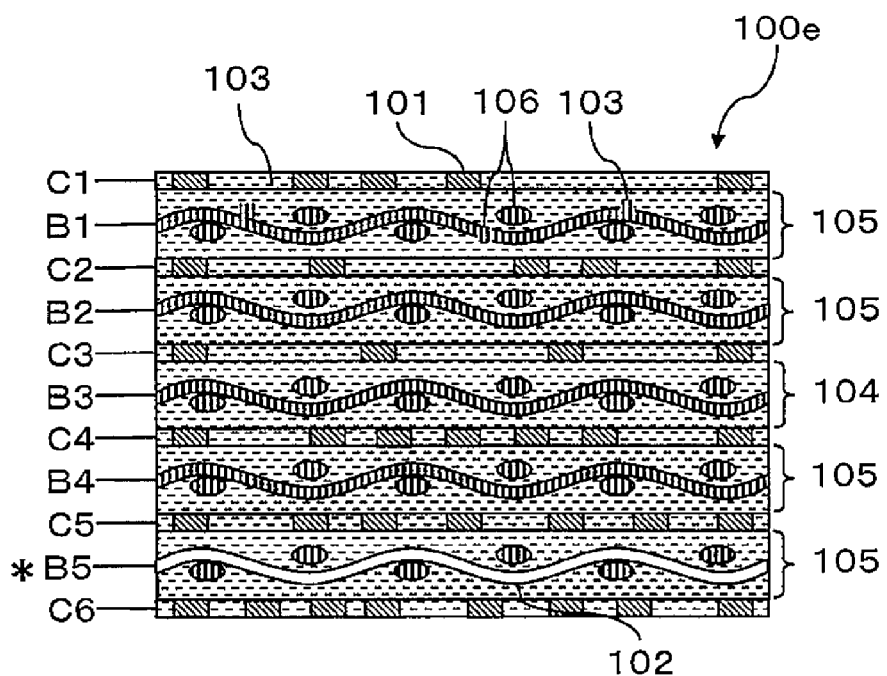
FIG. 7 is a cross-sectional view showing a further configuration of the multilayer wiring board according to the embodiment of the present invention.

FIG. 7 shows the configuration of a board 100e. The board 100e has six wiring layers C1 to C6 in this order from the top down and has five resin base material layers B1 to B5 interposed between the wiring layers in this order from the top down. (Each of the resin base material layers B1 and B2 is the build-up layer 105, the resin base material layer B3 is the base layer 104, and each of the resin base material layers B4 and B5 is the build-up layer 105.) The proportions of copper remaining in the wiring layers C are 32%, 28%, 37%, 46%, 52% and 54% in the order from the wiring layer C1. In these respects, the disposition and configuration are the same as those in the above-described board 100b.

In the board 100e shown in FIG. 7, resin base material layers having as a base material an arrangement of bundles of aramid fibers forming a warp and a weft were used for the resin base material layers B1, B2, B3 and B4, and a resin base material layer having as a base material an arrangement of bundles of aramid fibers and an arrangement of bundles of glass fibers respectively forming a warp and a weft was used only for the resin base material layer B5 forming the outermost layer at the bottom side (indicated by a reference mark (*) in FIG. 7).

Details of the configuration other than those described above, i.e., the thickness of each wiring layer C, the thickness of each resin base material layer B and the size of the board are the same as those in the board 100b. Further, the physical properties of the constituent elements of the board in the warpage simulation are the same as those in the above-described example.

Figure 8:
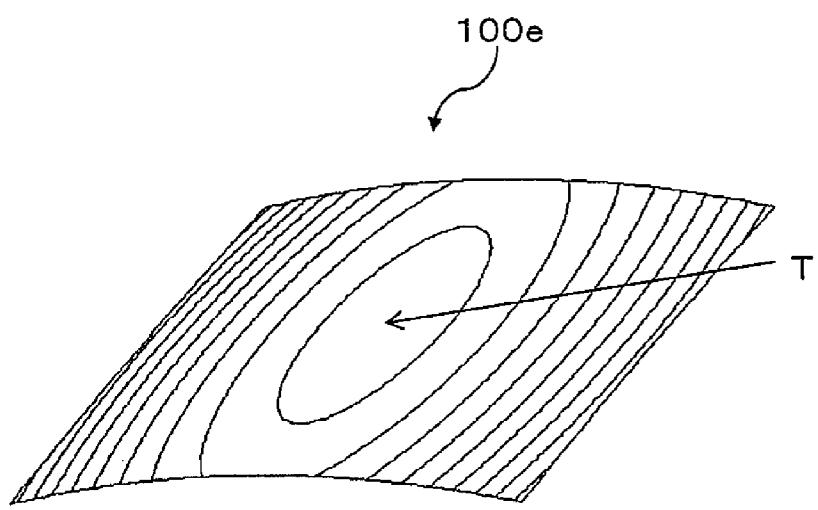
FIG. 8 is a diagram showing a result of a warpage simulation on the multilayer wiring board in FIG. 7.

FIG. 8 shows the result of the warpage simulation under a load at the maximum temperature 260° C. at the time of reflowing. From a comparison made between the result shown in FIG. 8 and the result shown in FIG. 14, i.e., the amount of warpage 0.57 mm in the board 100e shown in FIG. 8 and the amount of warpage 1.54 mm in the board 100g in FIG. 14, it can be understood that the present invention has reduced the warpage by about 63%.

In the board 100e shown in FIG. 7, the weft (glass fibers) has a linear expansion coefficient larger than that of the warp (aramid fibers) in the resin base material layer B5. Only in the corresponding weft direction, the amount of thermal expansion is larger than that in the other resin base material layers. A force therefore acts only in the weft direction of the resin base material layer B5 to warp the board so that the board is convexed downward. Accordingly, the force acting in the resin base material layers B to warp the board so that the board is convexed downward acts to cancel out the force acting in the wiring layers C to warp the board so that the board is convexed upward, thus reducing the warpage.

The effect of reducing warpage in the board 100e is higher than the effect of reducing warpage in the board 100d. This is due to the placement of the resin base material layer in the same meaning as in the description of "Warpage Simulation No. 3". The highest effect can be obtained when the resin base material layer using fiber bundles such that the linear expansion coefficients of the warp and the weft are different from each other is placed in the outermost layer.

In the above-described examples, glass fibers and aramid fibers were used. The difference between the linear expansion coefficients thereof was $6.5 \times 10^{-6}$ (1/° C.). However, while variations in characteristics of the fibers are considered, a certain effect can be expected if the difference is $1.0 \times 10^{-6}$ (1/° C.) or more. It is more preferable to set the difference to $6.5 \times 10^{-6}$ (1/° C.) or more.

As described above, a configuration in which fiber bundles having a linear expansion coefficient smaller than that of other fiber bundles are used for a warp or a weft in one of resin base material layers (Warpage Simulation No. 1 or 3) and a configuration in which fiber bundles having a linear expansion coefficient larger than that of other fiber bundles are used for a warp or a weft in one of resin base material layers (Warpage Simulation No. 5 or 6) are conceivable as a configuration for reducing warpage of a board. As is apparent from the results of the warpage simulations, in any of these configurations, warpage of the board can be reduced by producing in the resin base material layers B of the board a force acting to warp the board so that the board is convexed downward against a force acting in the wiring layers C of the board to warp the board so that the board is convexed upward.

While various examples of this embodiment for reducing warpage of the board have been described, the effect of reducing board warpage according to the above-described embodiment varies depending on non-uniformity of wiring elements in the wiring layers and variations in the proportion of copper remaining in the wiring layers or variations in the volumetric contents of fiber bundles in the resin base material layers. Further, in some case, a force acting in the resin base material layers of the board to warp the board so that the board is convexed downward is excessively large with respect to a force acting in the wiring layers of the board so that the board is convexed upward. In such a case, inverse warpage may occur.

In order to avoid such an event, a prediction as to whether or not warpage of the board is increased or inverse warpage is caused in a case where two or more types of fiber bundles are used in resin base material layers may be made on the basis of the multilayered beam theory described in the document shown below.

For such a prediction, the longitudinal elastic modulus and the linear expansion coefficient of each wiring layer and the longitudinal elastic modulus and the linear expansion coefficient of each resin base material layer are obtained in advance.

"Analysis of Stress and Deflection of Printed Plate Board Using Multilayered Beam Theory", Juhachi Oda and Shingo Abe, Transactions of the Japan Society of Mechanical Engineers. A 59(563) pp. 203-208.

The board having five resin base material layers according to this embodiment has been described, but the present invention is not limited to this. Further, this embodiment has been described with respect to the case where the base layer 104 exists at the center of the board, that is, there are an even number of wiring layers, but the present invention is not limited to this. According to the present invention, an effect similar to that of the foregoing embodiment can be exhibited also in a case where no base layer 104 exists at the center of the board, and where the board is constituted only by the build-up layers 105, that is, there are an odd number of wiring layers.

For example, in a case where the average of the proportions of copper remaining in the wiring layers in the lower section of the board excluding the wiring layer at the center of the board is larger than the average of the proportions of copper remaining in the wiring layers in the upper section of the board, warpage of the board can be reduced by either one of the following methods:

(1) a method of using, at least in one of the build-up layers 105 in the upper section of the board, fiber bundles in the weft direction having a linear expansion coefficient smaller than that of other fiber bundles, and (2) a method of using, at least in one of the build-up layers 105 in the lower section of the board, fiber bundles in the weft direction having a linear expansion coefficient larger than that of other fiber bundles.

This embodiment has been described with respect to the case where the linear expansion coefficient of fiber bundles as the warp or weft in one resin base material layer is set different from that of other fiber bundles, but the present invention is not limited to this. The present invention is also applicable to a case in which the linear expansion coefficient of fiber bundles as the warp or weft in two or more resin base material layers is set different from that of other fiber bundles.

Further, the linear expansion coefficient of the warp or weft may be changed in a certain portion in one layer. For example, referring to FIG. 15, a board is deformed so as to be convexed upward at the front side and convexed downward at the rear side. In this case, such a deformation can be cancelled out by reducing the linear expansion coefficient of the weft at the front side of the board in the resin base material layers above the base layer and by reducing the linear expansion coefficient of the weft at the rear side of the board in the resin base material layers below the base layer.

Figure 15:
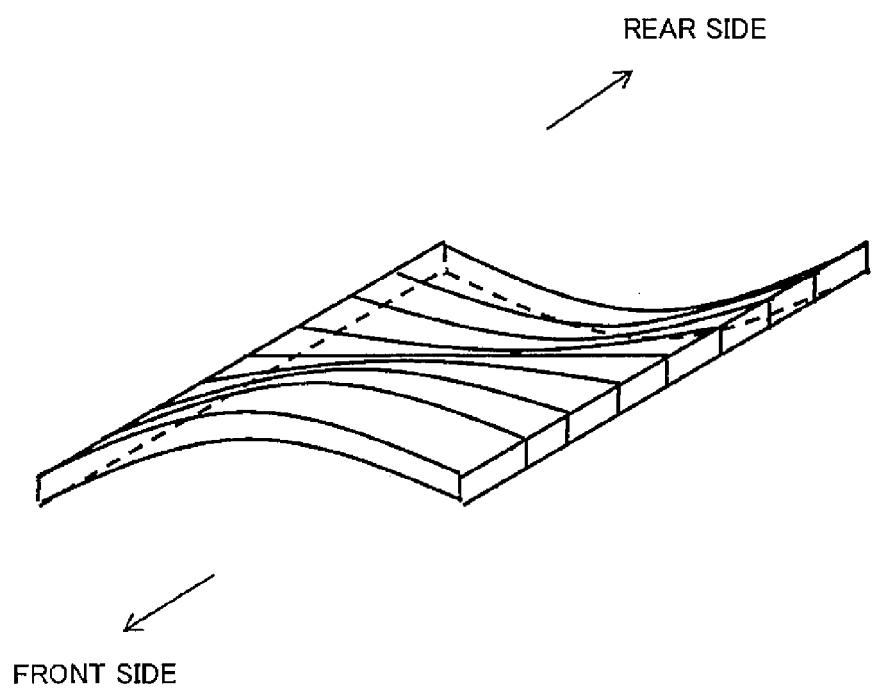
FIG. 15 is a diagram showing a complex deformation.

In the case shown in FIG. 15, the same effect can also be obtained by increasing the linear expansion coefficient of the weft at the front side of the board in the resin base material layers below the base layer and by increasing the linear expansion coefficient of the weft at the rear side of the board in the resin base material layers above the base layer.

The value of the linear expansion coefficient of fiber bundles is changed by the material of the fibers. In the present invention, therefore, making the material of at least part of the fiber bundles as the warp or weft different from the material of the other fiber bundles in at least one of the resin base material layers may suffice.

The present invention contributes to an improvement in the reliability of wiring boards mounted for forming electronic circuits, such as portable electronic devices and digital mobile products.

What is claimed is:

1. A multilayer wiring board comprising n wiring layers including a first insulating resin and a wiring element made of a conductive material, wherein n is an integer equal to or larger than 4, and (n−1) resin base material layers including fiber bundles in fabric form having warp direction fibers and weft direction fibers impregnated with a second insulating resin, the warp direction fibers being substantially perpendicular to the weft direction fibers, the n wiring layers and the (n−1) resin base material layers being laminated in an alternately layered manner, the n wiring layers are stacked so that a first wiring layer to a nth wiring layer are stacked in this order and the (n−1) resin base material layers are stacked so that a first resin base material layer to a (n−1)th resin base material layer are stacked in this order, the first wiring layer is adjacent to the first resin base material layer and the nth wiring layer is adjacent to the (n−1)th resin base material layer, wherein each of fiber bundles of the (n−1) resin base material layers have either a first linear expansion coefficient or a second linear expansion coefficient, the second linear expansion coefficient being different from the first linear expansion coefficient, all the fiber bundles of one of the weft direction fibers or the warp direction fibers in at least one specific (n−1) resin base material layer of the (n−1) resin base material layers have the first expansion coefficient and all the fiber bundles in the same direction in others of the (n−1) resin base material layers have the second linear expansion coefficient, and all the fiber bundles of another of the weft direction fibers or the warp direction fibers in all of the (n−1) resin base material layers have the second linear expansion coefficient.

2. The multilayer wiring board according to claim 1, wherein the conductive material is copper.

3. The multilayer wiring board according to claim 2, wherein n is an even number of 4 or more;

taking a n/2th resin base material layer of the (n−1) resin base material layers as a boundary, an average of proportions of the copper remaining in the first wiring layer to a n/2th wiring layer of the n wiring layers is smaller than an average of proportions of the copper remaining in a [(n/2)+1]th wiring layer to the nth wiring layer of the n wiring layers; and the fiber bundles of the one of the weft direction fibers or the warp direction fibers in at least one of the first resin base material layer to a [(n/2)−1]th resin base material layer of the (n−1) resin base material layers have the first linear expansion coefficient, the first linear expansion coefficient being smaller than the second linear expansion coefficient.

4. The multilayer wiring board according to claim 3, wherein the first linear expansion coefficient being smaller by at least $1 \times 10^{-6}$/° C. than the second linear expansion coefficient.

5. The multilayer wiring board according to claim 4, wherein the fiber bundles of the one of the weft direction fibers or the warp direction fibers in the first resin base material layer have the first linear expansion coefficient.

6. The multilayer wiring board according to claim 5, wherein the first linear expansion coefficient being smaller at least $6 \times 10^{-6}$/° C. than the second linear expansion coefficient.

7. The multilayer wiring board according to claim 2, wherein n is an odd number of 5 or more;

taking a [(n+1)/2]th wiring layer of the n wiring layers as a boundary, an average of proportions of the copper remaining in the first wiring layer to a [(n−1)/2]th wiring layer of the n wiring layers is smaller than an average of proportions of the copper remaining in a [(n+3)/2]th wiring layer to the nth wiring layer of the n wiring layers; and the fiber bundles of the one of the weft direction fibers or the warp direction fibers in at least one of the first resin base material layer to a [(n−1)/2]th resin base material layer of the (n−1) resin base material layers have the first linear expansion coefficient, the first linear expansion coefficient being smaller than the second linear expansion coefficient.

8. The multilayer wiring board according to claim 7, wherein the first linear expansion coefficient being smaller by at least $1 \times 10^{-6}$° C. than the second linear expansion coefficient.

9. The multilayer wiring board according to claim 2, wherein n is an odd number of 5 or more;

taking a [(n+1)/2]th wiring layer of the n wiring layers as a boundary, an average of proportions of the copper remaining in the first wiring layer to the [(n−1)/2]th wiring layer of the n wiring layers is smaller than an average of proportions of the copper remaining in a [(n+3)/2]th wiring layer to the nth wiring layer of the n wiring layers; and the fiber bundles of the one of the weft direction fibers or the warp direction fibers in at least one of a [(n+1)/2]th resin base material layer to the (n−1)th resin base material layer of the (n−1) resin base material layers have the first linear expansion coefficient, the first linear expansion coefficient being larger by at least $1 \times 10^{-7}$/° C. than the second linear expansion coefficient.

10. The multilayer wiring board according to claim 9, wherein the fiber bundles of the one of the weft direction fibers or the warp direction fibers in the (n−1)th resin base material layer of the (n−1) resin base material layers have a linear expansion coefficient, the first linear expansion coefficient being larger by at least $1 \times 10^{-6}$/° C. than the second linear expansion coefficient.

11. The multilayer wiring board according to claim 10, wherein the first linear expansion coefficient being larger by at least $6 \times 10^{-6}$/° C than the second linear expansion coefficient.

12. The multilayer wiring board according to claim 2, wherein n is an even number of 4 or more;

taking a n/2th resin base material layer of the (n−1) resin base material layers as a boundary, an average of proportions of the copper remaining in the first wiring layer to a n/2th wiring layer of the n wiring layers is smaller than an average of proportions of the copper remaining in a [(n/2)+1]th wiring layer to the nth wiring layer of the n wiring layers; and the fiber bundles of the one of the weft direction fibers or the warp direction fibers in at least one of a [(n/2+1)]th resin base material layer to the (n−1)th resin base material layer of the (n−1) resin base material layers have the first linear expansion coefficient, the first linear expansion coefficient being larger by at least $1 \times 10^{-6}$/° C. than the second linear expansion coefficient.

13. The multilayer wiring board according to claim 12, wherein the first linear expansion coefficient being larger by at least $6 \times 10^{-6}$/° C. than the second linear expansion coefficient.

* * * * *